(12) United States Patent
Phillips

(10) Patent No.: US 7,551,265 B2
(45) Date of Patent: Jun. 23, 2009

(54) CONTACT MATERIAL AND SYSTEM FOR ULTRA-CLEAN APPLICATIONS

(75) Inventor: Alton H. Phillips, E. Palo Alto, CA (US)

(73) Assignee: Nikon Corporation, Tokyo (JP)

( * ) Notice: Subject to any disclaimer, the term of this patent is extended or adjusted under 35 U.S.C. 154(b) by 960 days.

(21) Appl. No.: 10/956,606

(22) Filed: Oct. 1, 2004

(65) Prior Publication Data

US 2006/0073395 A1 Apr. 6, 2006

(51) Int. Cl.
*G03B 27/62* (2006.01)
*G03B 27/52* (2006.01)
*G03B 27/42* (2006.01)
*G03F 1/00* (2006.01)
*B65D 85/00* (2006.01)

(52) U.S. Cl. .............................. 355/75; 355/30; 355/53; 439/5; 414/935; 206/710

(58) Field of Classification Search .................. 355/30, 355/53, 77; 430/5; 134/1.3; 414/935; 206/455, 206/710; 250/492.2, 492.3; 378/35
See application file for complete search history.

(56) References Cited

U.S. PATENT DOCUMENTS

| | | | |
|---|---|---|---|
| 4,833,051 A | 5/1989 | Imamura | |
| 4,913,457 A | 4/1990 | Häfner et al. | |
| 4,966,519 A | 10/1990 | Davis et al. | |
| 5,044,871 A | 9/1991 | Davis et al. | |
| 5,061,444 A | 10/1991 | Nazaroff et al. | |
| 5,702,533 A | 12/1997 | Mundt | |
| 6,090,176 A | 7/2000 | Yoshitake et al. | |
| 6,110,844 A | 8/2000 | Rader et al. | |
| 6,216,873 B1 | 4/2001 | Fosnight et al. | |
| 6,239,863 B1 | 5/2001 | Catey et al. | |
| 6,281,510 B1 | 8/2001 | Yishitake et al. | |
| 6,317,479 B1 | 11/2001 | Chiba et al. | |
| 6,468,353 B1 | 10/2002 | Perlov et al. | |
| 6,492,067 B1 | 12/2002 | Klebanoff et al. | |
| 6,507,390 B1 | 1/2003 | Ivaldi | |
| 6,566,018 B2 | 5/2003 | Muzio et al. | |
| 6,573,980 B2 | 6/2003 | Wang | |
| 6,619,903 B2 | 9/2003 | Friedman et al. | |
| 6,646,720 B2 | 11/2003 | Ramamoorthy et al. | |
| 6,734,445 B2 | 5/2004 | Ramamoorthy et al. | |

(Continued)

FOREIGN PATENT DOCUMENTS

EP 1341042 A2 9/2003

(Continued)

*Primary Examiner*—Alan A Mathews
(74) *Attorney, Agent, or Firm*—Weaver Austin Villeneuve & Sampson LLP

(57) ABSTRACT

Techniques for minimizing contamination by particles that wear off of components that come into and out of contact with each other. The invention involves forming at least one of the components out of a magnetic material so that the particles that wear off of the component are magnetic themselves. Then a magnetic field is used to attract the particles. In one embodiment, the particles are attracted to and collected by a magnet. In this way, the particles are drawn away from any components that might be contaminated. In some embodiments, the magnetic component is also magnetized. In other embodiments, a magnet is placed in contact with the magnetic component. In other embodiments, each of the components that come into contact with each other are formed of a magnetic material.

38 Claims, 10 Drawing Sheets

U.S. PATENT DOCUMENTS

| | | | |
|---|---|---|---|
| 6,912,043 B2 * | 6/2005 | Galburt | 355/75 |
| 7,304,720 B2 * | 12/2007 | del Puerto et al. | 355/75 |
| 2002/0005369 A1 | 1/2002 | Nyseth | |
| 2002/0020763 A1 | 2/2002 | Hirae et al. | |
| 2003/0107137 A1 | 6/2003 | Stlierman et al. | |
| 2003/0217828 A1 | 11/2003 | Opuku-Adusei et al. | |
| 2003/0227605 A1 | 12/2003 | Del Puerto | |
| 2004/0019408 A1 | 1/2004 | Del Puerto et al. | |
| 2004/0135987 A1 | 7/2004 | Galburt | |
| 2004/0180270 A1 * | 9/2004 | Heerens | 430/5 |

FOREIGN PATENT DOCUMENTS

| | | | |
|---|---|---|---|
| EP | 1434094 A1 | | 6/2004 |
| JP | 5-150445 | | 6/1993 |
| JP | 3-455072 | | 2/1999 |
| JP | 11-04079 | * | 2/1999 |
| JP | 11-40479 | | 9/2000 |

* cited by examiner

CONTACT MATERIAL AND SYSTEM FOR ULTRA-CLEAN APPLICATIONS

FIELD OF THE INVENTION

The present invention relates generally to particle generation due to materials in contact with each other, and more specifically to preventing such particles from being a source of contamination.

BACKGROUND

Many mechanical systems have components that come in and out of contact with each other during operation. The contact points between two such components are sources of "wear particles" that are generated in three ways: abrasion, adhesion, and fatigue. These types of physical interaction occur when the components come into contact with each other and then when the components separate from each other. Wear particles are small particles that break away from the body of a component and are then free to float around a system. Wear particles can be very small in size, but they can present problems in terms of contaminating clean system operating environments.

Wear particles are generated through abrasion when any amount of rubbing between two components causes one component to scratch and/or cut off particles from the other component. Typically, the component that is formed of the harder material will cause particles to be rubbed off of the softer component. Even very small amounts of rubbing can cause wear particles to form through abrasion. Adhesion can cause wear particles when the material of a first component adheres to the material of a second component and is pulled out from the main body of the first component upon separation of the components. With adhesion, the softer material tends to adhere to the harder material and then gets pulled away. However, portions of a harder material can also get pulled out of its body by a softer material. Fatigue can cause wear particle generation because the cyclical contact between two components can cause flexing or deformation of a material to the point where particles start to break away.

FIG. 1 illustrates a diagrammatic view of a mechanical system 100 wherein two components, component A 102 and component B 104 come in and out of contact with each other such that wear particles 106 are generated. Notice that the wear particles 106 float around and contaminate a process device 108 within mechanical system 100. Wear particles 106 can be referred to as airborne or gas-borne particles as they can be small enough to float through a system. Again, wear particles 106 are broken away from components A and B, 102 and 104, because the components come in and out of contact with each other. Wear particles 106 can come from component A 102 and/or component B 104.

Mechanical system 100 can be in any type of application. For example, one application is a semiconductor manufacturing system wherein process device 108 is one of the subsystems that can be adversely affected by wear particles 106. One such process device 108 is a reticle handling system used in photolithographic processes. In photolithography, reticles are the templates, which are used to optically copy an image of a circuit pattern onto a film, known as a photoresist. Reticles can be formed of a quartz plate that has a chrome-patterned region formed on one of the reticle surfaces. A defect on the reticle will appear as a defect on the transferred image in the photoresist. Wear particles generated from mechanical components that make contact with each other are one source of such defects on a reticle. For example, an end-effector used to manipulate a reticle will come into contact with a reticle. An end-effector is, for example, a robotic arm. Then at a later time, the end-effector will disconnect from the reticle such that particles are formed. This type of physical contact is just one of the many sources of wear particle generation in a semiconductor manufacturing system.

In conventional photolithography systems, reticles are protected from particle contamination by a pellicle. A pellicle is a thin, optically clear membrane, which covers the pattern on the reticle. The pellicle can be easily cleaned without damaging the reticle pattern. The pellicle supported over the patterned area of the reticle by a surrounding wall. The wall and pellicle enclose a small interior volume over the patterned region of the reticle. The opposite surface of the reticle plate, which is not patterned is not protected because, without any patterning, the surface is easy to clean. Also, particles that fall on the opposite surface of the reticle from the pellicle are outside the optical system focal range and do not show up as defects on the photoresist. Typically, there is a filtered opening in the surrounding wall that allows for pressure equalization within the interior volume created by the pellicle and the wall. The filter also allows for gas flow in and out of the interior volume without the introduction of particles that would be large enough to be considered as defects.

Although pellicles have proven to be effective devices for protecting reticles from contamination, future-generations of semiconductor manufacturing systems will employ extreme ultraviolet (EUV) lithography, which uses a smaller wavelength light capable of higher resolution image transfer. Unfortunately, there exists no practical pellicle for protecting EUV reticles. One reason for this is that the extremely small wavelength of light used in EUV systems are easily absorbed by many mediums, including the pellicle. Use of the pellicle would be impracticable because extremely high intensity light sources would be needed to achieve a practical manufacturing throughput. An exemplary wavelength of light used by EUV systems is approximately 13 nm. Therefore, the reticle handling system for EUV systems will require new techniques for protecting the reticle from particles.

Much effort has been put forth to find techniques for reducing wear particle generation in all types of semiconductor manufacturing systems. One approach is to carefully select the material that forms components that come in contact with each other. For instance, it has been found that polyimide material in contact with a reticle (either bare ULE™ or Chrome (Cr) coating) generates a low number of airborne or gas-borne particles. In contrast to polyetheretherketone (PEEK, which is typically used in end-effectors) generates a relatively large number of airborne or gas-borne particles.

Efforts have also been concentrated on preventing such particles from reaching critical process components, such as patterned regions of a reticle. Several techniques have been suggested, including photophoresis, electrophoresis, thermophoresis, magnetophoresis, electrically grounding a reticle to its to surroundings, using removable covers, and removable pellicles. Unfortunately, all of the techniques for protecting reticles from airborne or gas-borne particles have shortcomings.

Photophoresis uses a relatively weak force and requires a powerful optical source to drive particles away from the reticle. Electrophoresis, magnetophoresis, and electrical grounding are not effective on electrically neutral particles. Removable covers and pellicles do not completely block the reticle and generate particles during contact events with the reticle or end-effector. Thermophoresis is not effective in high vacuum environments and is not effective on particles where Brownian forces dominate particle motion.

Some have suggested eliminating particle generation altogether by either using electrostatic and/or electromagnetic techniques of levitating and moving the reticle without physical contact. These non-contact handling techniques also have shortcomings. Electrostatic levitation systems have limited reticle transfer rates because of weak levitation forces, the accompanying electrostatic fields may drive charged particles to the reticle and exacerbate contamination, and implementation of such systems drastically increases the costs of reticle handling systems. Electromagnetic levitation systems generate large amounts of heat, makes reticle handling systems significantly more expensive, and require adding magnetic material to reticles, which adds additional process steps to reticle manufacturing processes and increases reticle costs.

In view of the foregoing, there are continuing efforts to provide improved systems that have components that come in and out of contact with each other where the components do not generate wear particles. Efforts also continue in providing improved techniques for preventing these wear particles from migrating to surrounding process components that may be adversely affected by the particles.

BRIEF SUMMARY OF THE INVENTION

The present invention is directed to techniques for minimizing contamination by particles that wear off of components that come into and out of contact with each other. The invention involves forming at least one of the components out of a magnetic material so that the particles that wear off of the component are magnetic themselves. Then a magnetic field is used to attract the particles. In one embodiment, the particles are attracted to and are collected by a magnet. In this way, the particles are drawn away from any components that might be contaminated.

As an apparatus, one embodiment of the present invention includes at least a first component, a second component, and a magnetic element. The second component is made of a magnetic material and the first component and the second component can be placed into contact with one another. The magnetic element is positioned adjacent to the first component and the second component and the magnetic element is configured to generate a magnetic field in the vicinity of the first and the second components. Magnetic particles are generated when the first component and the second component are in contact and are then moved in a direction of high flux density created by the magnetic element. In an alternative embodiment, the second component is formed of a softer material than the material that forms the first component. In another embodiment, the apparatus includes a semiconductor manufacturing device that is positioned proximate to the first and second components, wherein the magnetic element prevents the magnetic particles from contaminating the semiconductor manufacturing device.

As a method, one embodiment of the present invention includes at least providing a first and a second component wherein the second component is magnetic, placing the first component into contact with the second component wherein magnetic particles are generated, and positioning a magnetic element adjacent to the first component and the second component, the magnetic element configured to generate a magnetic field in the vicinity of the fist and second components so that the magnetic particles are moved in a direction of high flux density created by the magnetic element.

As a system, one embodiment of the invention includes at least an illumination source, an optical system, a reticle stage arranged to retain a reticle, a working stage arranged to retain a work piece, an enclosure that surrounds at least a portion of the working stage, the enclosure having a sealing surface, a first component, a second component, and a magnetic element. The second component is made of magnetic material and the first and the second components ban be placed in contact with one another. The magnetic element is positioned adjacent to the first and second components wherein the magnetic element is configured to generate a magnetic field in the vicinity of the first and the second components. Magnetic particles generated when the first component and the second component are in contact are moved in a direction of high flux density created by the magnetic element.

These and other features and advantages of the present invention will be presented in more detail in the following specification of the invention and the accompanying figures, which illustrate by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known operations have not been described in detail so not to unnecessarily obscure the present invention.

The present invention pertains to techniques for minimizing contamination by particles that wear off of components that come into and out of contact with each other. The invention involves forming at least one of the components out of a magnetic material so that the particles that wear off of the component are magnetic themselves. Then a magnetic field is used to attract the particles. In one embodiment, the particles are attracted to and collected by a magnet. In this way, the particles are drawn away from any components that might be contaminated. The inventive technique can be advantageously used in systems that are required to operate in a clean environment, for example, semiconductor manufacturing systems, and especially extreme ultraviolet semiconductor manufacturing systems.

Figure 1:
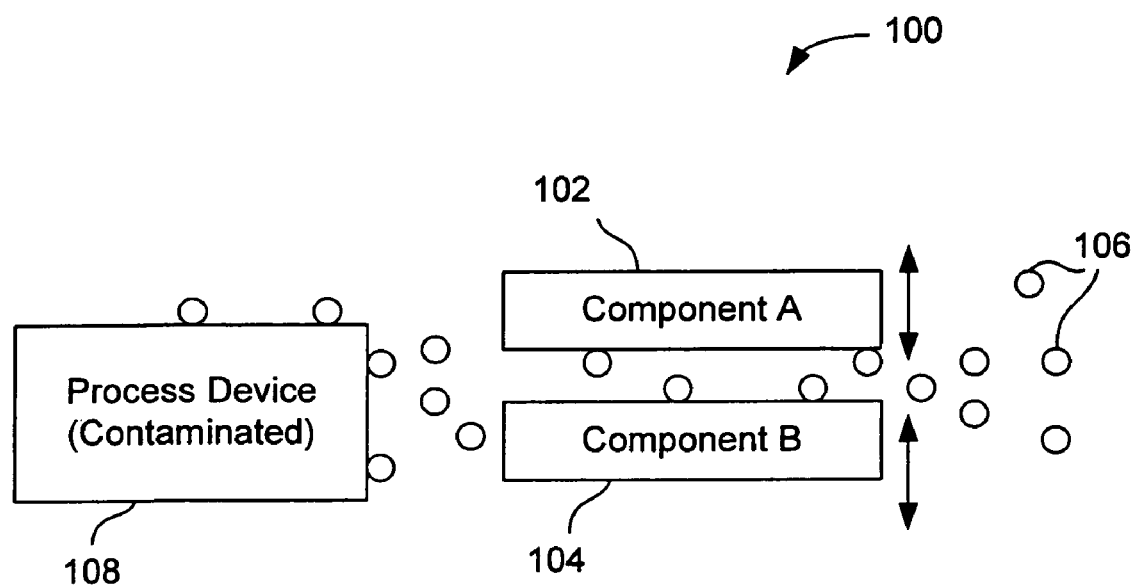
FIG. 1 illustrates a diagrammatic view of a mechanical system wherein two components, component A and component B, come in and out of contact with each other such that wear particles are generated.
Figure 2:
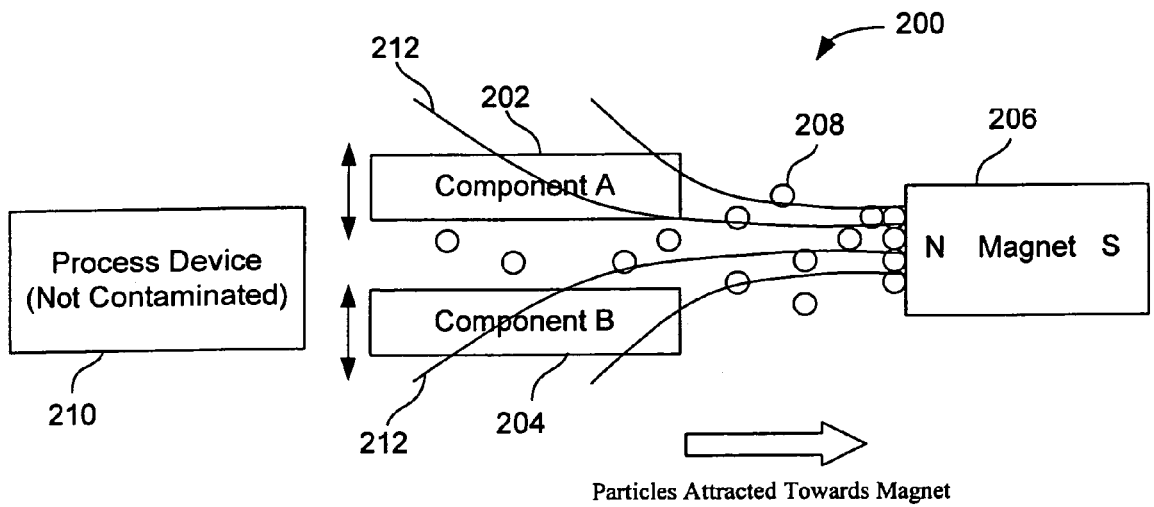
FIG. 2 illustrates a diagrammatic view of a particle collection system according to one embodiment of the invention.

FIG. 2 illustrates a diagrammatic view of a particle collection system 200 according to one embodiment of the invention. Particle collection system 200 includes component A 202, component B 204, a magnet 206, particles 208, and a process device 210. Magnet 206 creates a magnetic field that flows along magnetic field lines 212. As should be understood, a magnet is a structure that creates a magnetic field and is able to attract magnetic materials. Components A and B, 202 and 204, are any two components that make contact with each other and then separate from each other. The vertical, bi-directionally arrowed lines represent the relative movement between components A and B, 202 and 204. In some embodiments, components A and B, 202 and 204, come in and out of contact many times during normal operation of a system of which they are a part. Particles 208 emanate from one or both of components A and B, 202 and 204. Note that components A and B, 202 and 204, can come in and out of contact with each other along various axial directions in addition to the vertical axis shown in FIG. 2. For instance, components A and B, 202 and 204, could also move along a tiled or horizontal axis. Actually, each of components A and B can move in various and random directions before and after making contact with each other. For example, components A and B, 202 and 204, can be on respective halves of a reticle container wherein the exact motion of the components is not definite. This can be the case when a human operator handles the reticle container.

Magnet 206 causes magnetic field lines 212 to pass through the region occupied by components A and B, 202 and 204, in order to attract any of particles 208 that are magnetic. Particles 208 are attracted towards a region of high magnetic flux density. The magnetic field typically forms a circuit of magnetic field lines that flow between opposing poles of a magnet. For example, the magnetic field lines travel between a north pole and a south pole of a magnet. Although not shown, it should be understood that magnetic field lines 212 extend away from the north pole (N) of magnet 206 and at least some of lines 212 loop back around towards the south pole (S). It should also be understood that process device 210 can be any type of device that needs to be kept free of contaminants, for example, particles 208 that emanate from either of components A and/or B, 202 and/or 204. Note that in some embodiments, particles 208 can wear off of components A and B, 202 and 204, when they remain in contact with each other and slide against each other.

At least one of components A or B, 202 or 204, is formed of a magnetic material. In this way, particles 208 that wear off of the magnetic component A or B are also magnetic. It is desirable that particles 208 are magnetic so that they can be attracted by magnet 206. It is also desirable that the component that is more likely to generate particles 208 be formed of a magnetic material so that the particles will also be magnetic. In some cases, this means that the component A or B, 202 or 204, which is made of magnetic material is also formed of a softer material than that of the other component.

In alternative embodiments, both of components A and B, 202 and 204, are formed of a magnetic material. In such embodiments, particles 208 from each of the components will be attracted to magnet 206. This is advantageous in the event that particles 208 wear off of not only the softer component, but also the opposing and harder component. In some embodiments, components A and B, 202 and 204, can have the same or approximately the same hardness.

Magnetic materials for forming components A and/or B include ferromagnetic and ferrimagnetic materials. Ferromagnetic materials include iron, nickel, cobalt, manganese, and steel. Some other exotic ferromagnetic materials can also be used. Ferromagnetic materials are strongly influenced by magnetic fields and can become strong magnets themselves. One ferrimagnetic material is magnetite, a crystal that occurs naturally in rocks called lodestones. Ferrimagnetic materials are, in general, oxides of iron combined with one or more of the transition metals such as manganese, nickel or zinc, e.g. $MnFe_2O_4$. Permanent ferrimagnets often include barium. The raw material is turned into a powder, which is then fired in a kiln or sintered to produce a dark gray, hard, brittle ceramic material having a cubic crystalline structure. Components A and B, 202 and 204, can also be made out of alloys of ferromagnetic or ferromagnetic materials.

It is possible to also form components A and/or B, 202 and/or 204, out of paramagnetic materials even through they are typically more weakly attracted to magnets. Paramagnetic materials include aluminum, gold, and copper.

In one embodiment, the magnetic material used to form one or both of components A and B, 202 and 204, is nickel. Nickel is advantageous in that nickel does not corrode in air and is electrically conductive. Specifically, nickel does not corrode in air at temperatures below approximately 400 degrees Celsius. Nickel is also magnetic down to the atomic level so that every particle that breaks off of a nickel component, no matter how small, will be attracted by a magnetic field. Generally, nickel is commercially available in purities exceeding 99.9%.

In some embodiments, it is useful to form components A and/or B, 202 and/or 204, out of electrically conductive materials so that they can be electrically grounded.

When considering contact between a reticle and a component that comes in contact with a reticle, it is useful to form that component out of nickel. It is preferable that the reticle contact surface also be made of nickel or a material that is substantially harder than nickel so that particles will more likely wear off of the nickel component rather than the reticle contact surface. In EUV lithography, possible reticle surface contact materials include Zerodur™, ULE™, molybdenum silicide, and chrome.

This is because some portions of the reticle are formed from chrome and it is more desirable to have particles wear off of the component and not the reticle.

In some embodiments, only the portions of each component that comes into contact with the other component is formed of a magnetic material. In this way, the particles that wear off of a magnetic component will be magnetic and therefore able to be collected by magnet 206.

Components A and B, 202 and 204, could be for example within a semiconductor manufacturing system where component A 202 is a reticle and component B 204 is anything that comes into contact with the reticle. Component B 204 can be a robot arm used to transport the reticle, a reticle stage for supporting the reticle, or a container used to protect the reticle during storage and transportation. More generally, components A and B, 202 and 204, can be any two structures that come into contact with each other. For example, components A and B, 202 and 204, can be gate valves in a gate door and a gate doorframe. Components A and B, 202 and 204, can also be used as interfacing contacts between any two of the following: reticles, reticle stages, end-effectors, sealing components, removable pellicles for protecting a reticle, the sealing interface of gate values, sliding contact bearings, kinematic mounts, components within a wafer handling system, electrostatic and vacuum chucks, reticle carrier covers and doors, and components within belt and pulley systems. The term end-effectors refers to any device used to transport or support another device. For example, end-effectors are used to transport reticles and wafer.

In these cases, process device 210 can be for example, a device used in a semiconductor manufacturing system that is sensitive to contamination. Such devices are, for example, a reticle, components used to transport and store reticles, semiconductor wafers, and components that transport, store, or work on semiconductor wafers.

Particles can wear off of component A 202 and/or component B 204 when they are in contact with each other and when they separate from each other. When in contact with each other, particles can emanate from one or both of the components through abrasion or fatigue. Particles 208 can wear off of each other through abrasion when the components move relative to each other when in contact, even if only a very small amount. For example, the two components can rub against each other slightly. Typically, particles will more easily wear off of the component formed of the softer material. With movement, small projections in each of the components 202 and 204 can break off or cut off particles from the surface of the other component. Fatigue of each component 202 and 204 can also occur when each component causes repeated flexing in itself and in the other component. As discussed above, particles 208 can also wear off when components A and B separate from each other due to adhesion.

Sometimes, material from both of components A and B, 202 and 204, will wear off of their respective components and be stuck to each other. For example, when each component separates from each other, material from each component can adhere to each other and break off together. Such particles 208 are formed of material from both components and still be attracted towards magnet 206 since at least part of particle 208 is formed of a magnetic material. In the embodiments where both components A and B, 202 and 204, are formed of magnetic materials, particle 208 will be completely magnetic and be fully attracted to magnet 206.

The magnetic field attracts the particles 208 that are magnetic. Magnet 206 and its magnetic field attract particles 208 such that particles 208 are not free to disperse and possibly contaminate other nearby devices such as process device 210. Magnetic field lines 212 show that the magnetic field flows through the region where components A and B, 202 and 204, make contact. This is such that particles 208 that wear off of the components can be attracted by the magnetic field. Magnetic field lines 212 should also flow through the space occupied by each of components A and B, 202 and 204, after they separate from each other so that particle 208 that break off can be collected by magnet 206 even after the components completely separate from each other. Magnet 206 can be a permanent magnet, non-permanent magnet, or an electromagnet.

In FIG. 2, magnet 206 is placed on the opposite side of components A and B, 202 and 204, in order to attract particles 208 away from process device 210. In other embodiments, magnet 206 could be on the same side of components A and B, 202 and 204, and still successfully collect particles 208.

Figure 3:
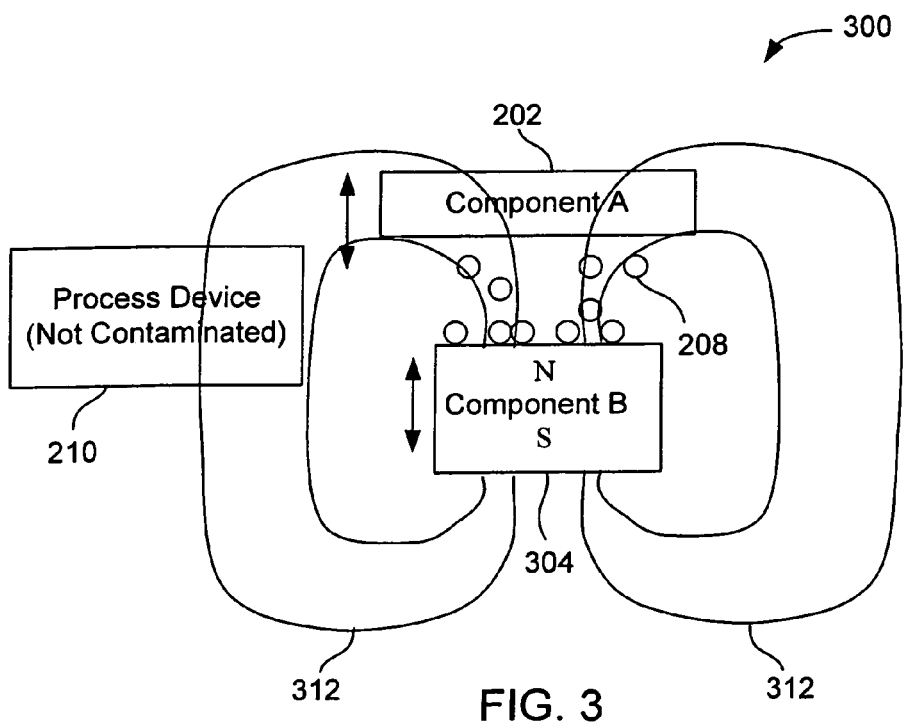
FIG. 3 illustrates a diagrammatic view of a particle collection system according to an alternative embodiment of the present invention.

FIG. 3 illustrates a diagrammatic view of a particle collection system 300 according to an alternative embodiment of the present invention. System 300 includes components A and B, 202 and 304, a magnetic field having field lines 312, and a process device 210. Components A and B, 202 and 304, can come into and out of contact with each other such that particles 208 emanate from one or both of the components. Component B 304 is also magnetized so that it generates a magnetic field having magnetic field lines 312. System 300 easy to manufacture since a separate magnet is not required in addition to component B 304. Magnetizing component B 304 is also beneficial since particles that wear off of component B 304 need not travel very far, if any distance at all, until they are trapped by the magnetic force.

In this embodiment, particles 208 that wear off of component B 304 are attracted towards component B 304. In the same spirit as particle collection system 200 of FIG. 2, component B 304 collects particles 208 so that they do not contaminate process device 210. Therefore, particles 208 either remain attached to component B 304 or break away and then are attracted right back onto component B 304. Component B 304 can be formed of a ferromagnetic or a ferrimagnetic, or an alloy of either or both.

In some embodiments, component B 304 is formed of a softer material than the material forming component A 202 such that particles 208 are more likely to wear off of component B 304. In such embodiments, most of particles 208 will be magnetic and be capable of being attracted by the magnetic field of component B 304.

The magnetic field created by component B 304 flows through component B 304, component A, and process device 210. The magnetic field can be formed to flow through various components, less than all of the components, and be designed to have a certain field strength that is appropriate for preventing contamination of process device 210. The magnetic field forms a magnetic circuit that flows between the north and south poles of component B 304. Component B 304 can be a permanent magnet or an electromagnet.

In some embodiments, component A 202 can be formed of a magnetic material so that particles that wear off of component A 202 can also be attracted by the magnetic field of component B 304. In other words, both of component A 202 and component B 304 would be formed of magnetic material. In some embodiments, components A 202 and component B 304 are magnetized nickel.

In some embodiments, component A 202 and component B 304 can remain in contact with each other while at least one of the components still generates particles. This can occur through the pressure that each component can force upon each other or through small amounts of sliding with respect to each other.

Figure 4:
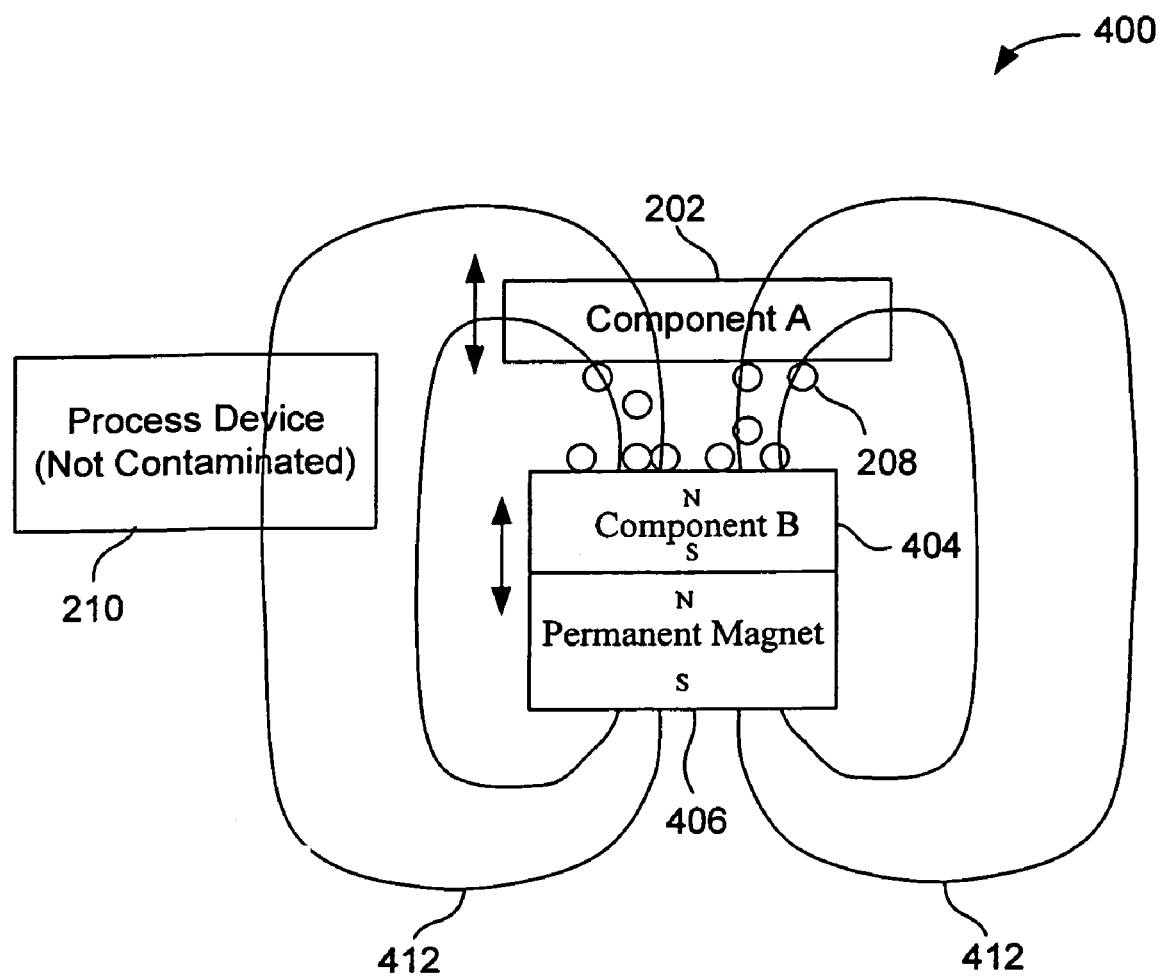
FIG. 4 illustrates a diagrammatic view of a particle collection system according to yet another alternative embodiment of the present invention.

FIG. 4 illustrates a diagrammatic view of a particle collection system 400 according to yet another alternative embodiment of the present invention. Particle collection system 400 includes component A 202, component B 404, a magnetic field having field lines 412, a magnet 406 that creates the magnetic field, and a process device 210. Component A 202 and component B 404 can come into and out of contact with each other such that particles emanate from at least one of the components. In FIG. 4, component B 404 is placed in contact with a magnet 406 such that component B 404 becomes part of the magnetic circuit created by magnet 406. The magnetic circuit flows through component B 404 to create north and south poles within component B 404. In this way, component B 404 becomes magnetized and attracts particles 208 that wear off of component B 404. Again, the magnetic field attracts particles 208 towards component B 404 to prevent particle contamination of process device 210.

In an alternative embodiment, magnet 406 is placed adjacent to component B 404 without actually making contact with magnet 406. In this embodiment, component B 404 is still part of the magnetic circuit created by magnet 406 with north and south poles as shown in FIG. 4.

In some embodiments, component B 404 is made of a softer material than the material that forms component A 202. In such embodiments, particles 208 are more likely to originate from component B 404, rather than component A. Therefore, most of particles 208 will be magnetic and be attracted towards component B 404.

Component A 202 is not magnetic, however, component A 202 can be formed of a magnetic material in alternative embodiments such that particles that wear off of component A 202 will also be attracted towards component B 404.

In some embodiments, both of the contacting components can be magnetized so that particles that wear off of one or both of the components can be attracted to either component. The strength of the magnetic forces should be carefully set so that it is not excessively difficult to separate to the two magnetized components.

Figure 5:
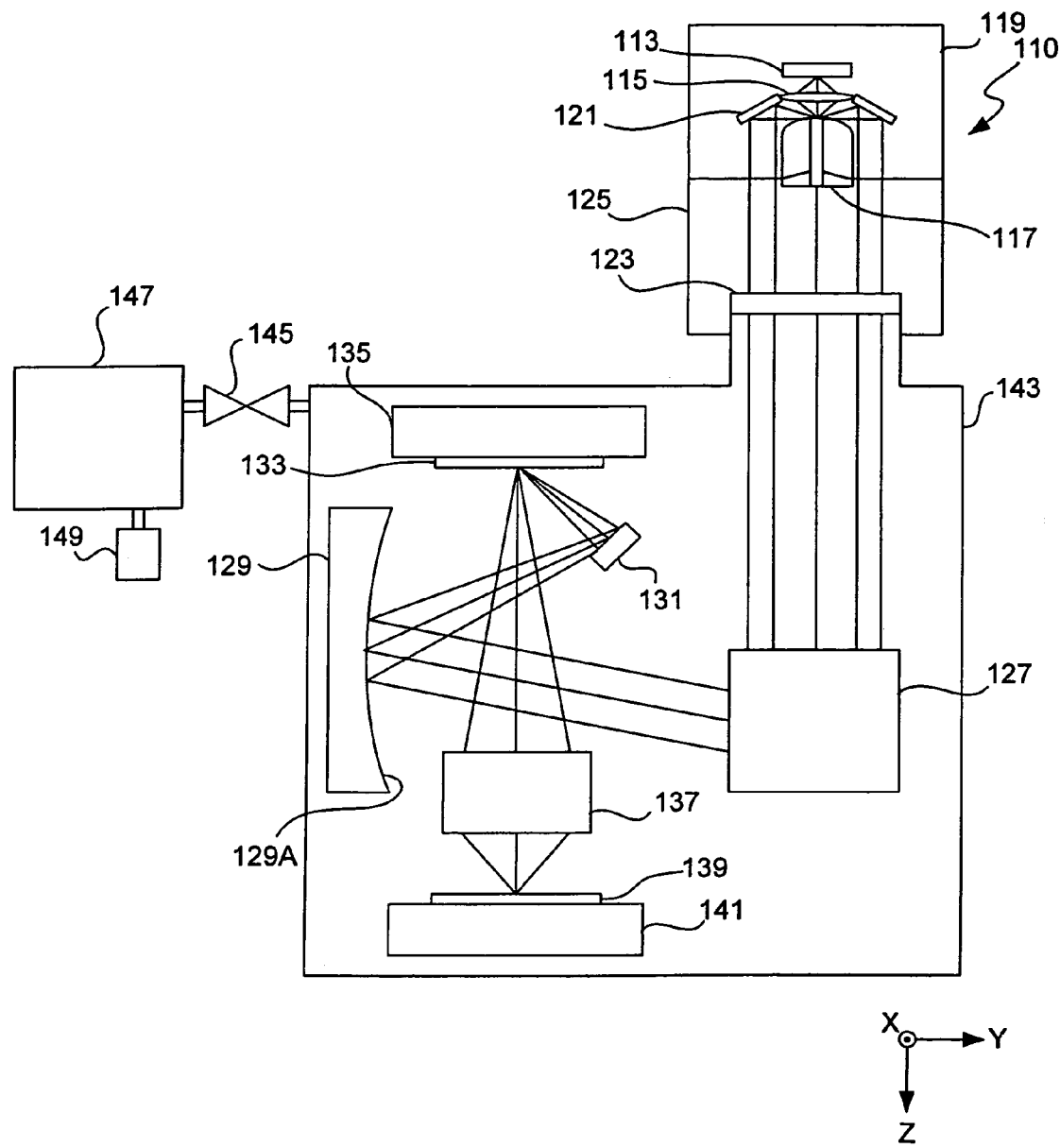
FIG. 5 illustrates one exemplary lithographic exposure apparatus that incorporates the present invention.
Figure 8:
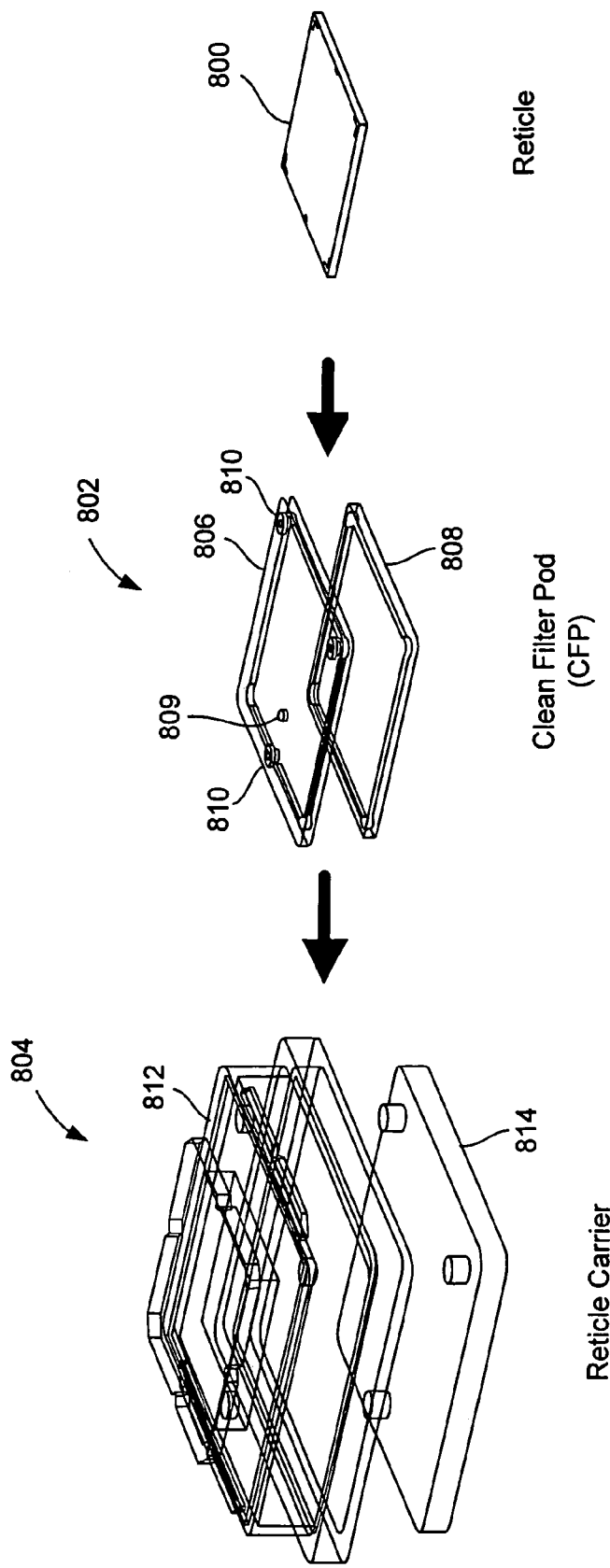
FIG. 8 illustrates an EUV reticle, a clean filter pod, and a reticle carrier according to one embodiment of the invention.
Figure 9:
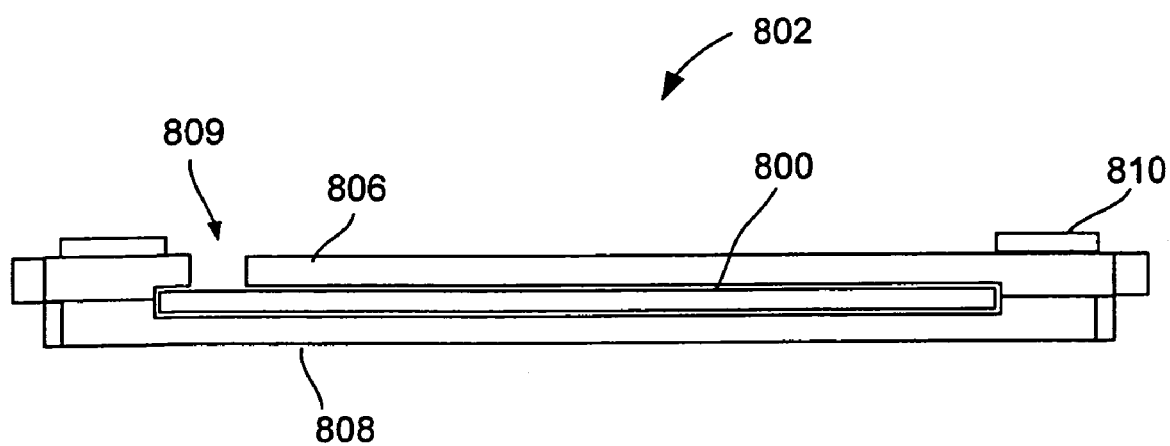
FIG. 9 illustrates a side plan view of the clean filter pod of FIG. 8, which contains a reticle.
Figure 10:
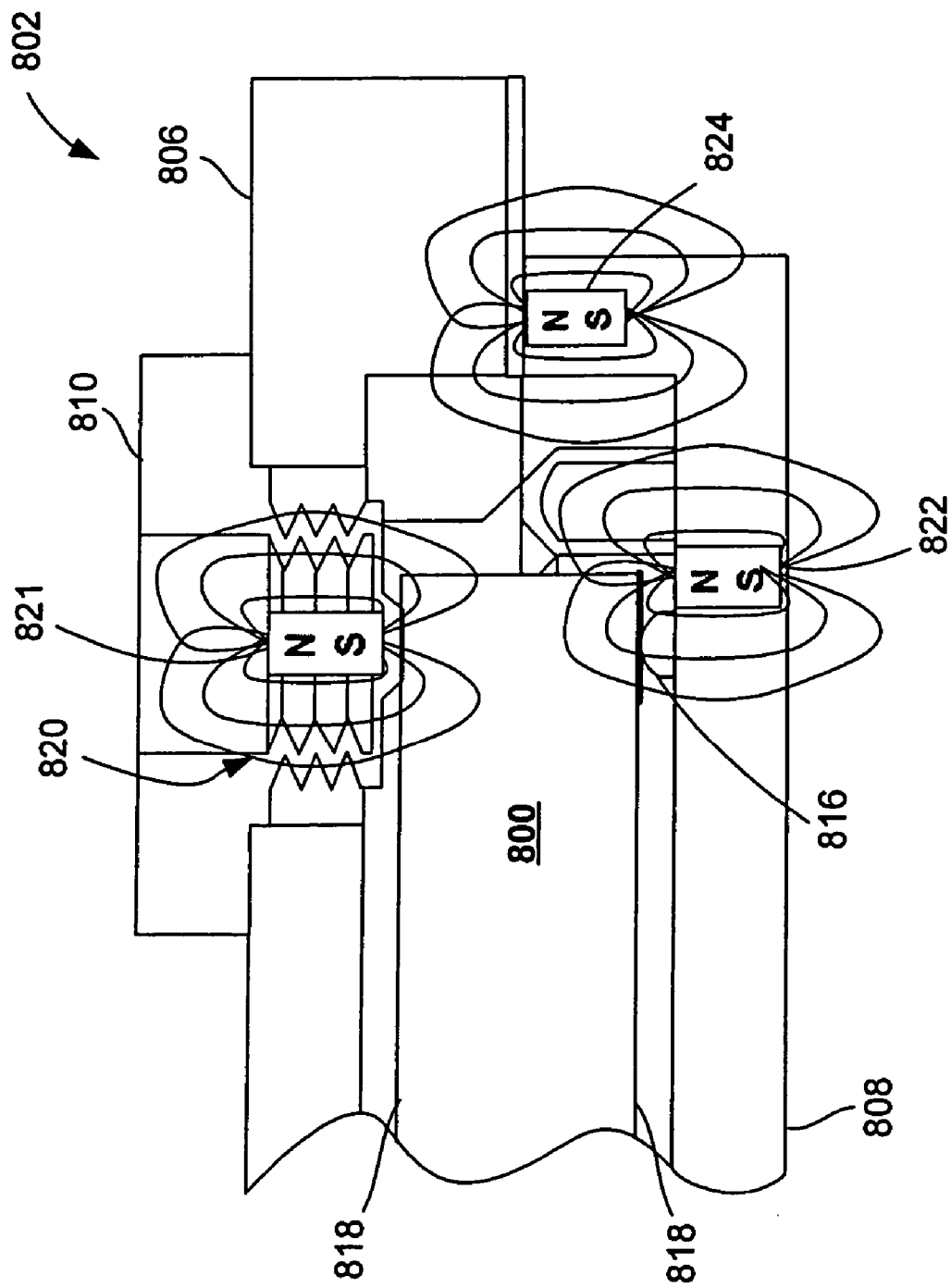
FIG. 10 illustrates an enlarged and partial view of a reticle that is enclosed within a clean filter pod, according to one embodiment of the present invention.

The description will now move onto some exemplary systems that can advantageously utilize the present invention. FIGS. 5-10 will illustrate systems related to semiconductor manufacturing that can utilize the present invention in order to maintain the high standards of cleanliness that are needed. FIG. 5 illustrates a conventional lithographic exposure-apparatus 100 and FIGS. 8-10 illustrate components used in lithographic exposure systems that utilize extreme ultraviolet wavelength light. The present invention can be incorporated in many of the components that make contact with each other to reduce the proliferation of particles that may cause contamination. As is commonly known, minimizing contamination in semiconductor manufacturing related systems is critical. One important region to maintain as clean as possible is the region through which a reticle is used and stored. For example, component A and component B from the above description could be a reticle and a mechanical structure that transports or stores the reticle, respectively.

FIG. 5 shows an EUV (or soft-X-ray SXR) system 110, including the EUV mirror of this invention as described above. As a lithographic energy beam, the EUV system 110 uses a beam of EUV light of wavelength $\lambda$=13 nm. The depicted system is configured to perform microlithographic exposures in a step-and-scan manner.

The EUV beam is produced by a laser-plasma source 117 excited by a laser 113 situated at the most upstream end of the depicted system 110. The laser 113 generates laser light at a wavelength within the range of near-infrared to visible. For example, the laser 113 can be a YAG laser or an excimer laser. Laser light emitted from the laser 113 is condensed by a condensing optical system 115 and directed to the downstream laser-plasma source 117. Upon receiving the laser light, the laser-plasma source 117 generates SXR (EUV) radiation having a wavelength ($\lambda$) of approximately 13 nm with good efficiency.

A nozzle (not shown), disposed near the laser-plasma source 117, discharges xenon gas in a manner such that the discharged xenon gas is irradiated with the laser light in the laser-plasma source 117. The laser light heats the discharged xenon gas to a temperature sufficiently high to produce a plasma that emits photons of EUV light as the irradiated xenon atoms transition to a lower-potential state. Since EUV light has low transmittance in air, the optical path for EUV light propagating from the laser-plasma source 117 is contained in a vacuum chamber 119 normally evacuated to high vacuum. Since debris normally is produced in the vicinity of the nozzle discharging xenon gas, the vacuum chamber 119 desirably is separate from other chambers of the system.

A parabolic mirror 121, coated with a Mo/Si multilayer film, is disposed relative to the laser-plasma source 117 so as to receive EUV light radiating from the laser-plasma source 117 and to reflect the EUV light in a downstream direction as a collimated beam. The multilayer film on the parabolic mirror 121 is configured to have high reflectivity for EUV light of which $\lambda$=approximately 13 um.

The collimated beam passes through a visible-light-blocking filter 123 situated downstream of the parabolic mirror 121. By way of example, the filter 123 is made of Be, with a thickness of 0.15 nm. Of the EUV radiation reflected by the parabolic mirror 121, only the desired 13-nm wavelength of radiation passes through the filter 123. The filter 123 is contained in a vacuum chamber 125 evacuated to high vacuum.

An exposure chamber 143 is disposed downstream of the filter 123. The exposure chamber 143 contains an illumination-optical system 127 that comprises a condenser mirror and a fly-eye mirror (not shown, but well understood in the art). The illumination-optical system 127 also is configured to trim the EUV beam (propagating from the filter 123) to have an arc-shaped transverse profile. The shaped "illumination beam" is irradiated toward the left in the figure.

A circular, concave mirror 129 is situated so as to receive the illumination beam from the illumination-optical system 127. The concave mirror 129 has a parabolic reflective surface 129a and is mounted perpendicularly in the vacuum chamber 143. The concave mirror 129 comprises, for example, a quartz mirror substrate of which the reflection surface is machined extremely accurately to the desired parabolic configuration. The reflection surface of the mirror substrate is coated with a Mo/Si multilayer film so as to form the reflective surface 129a that is highly reflective to EUV radiation of which $\lambda$=13 nm. Alternatively, for other wavelengths in the range of 10-15 nm, the multilayer film can be of a first substance such as Ru (ruthenium) or Rh (rhodium) and a second substance such as Si, Be (Beryllium) or $B_4C$ (carbon tetraboride).

A mirror 131 is situated at an angle relative to the concave mirror 129 so as to receive the EUV beam from the concave mirror 129 and direct the beam at a low angle of incidence to a reflective reticle 133. The reticle 133 is disposed horizontally so that its reflective surface faces downward in the figure. Thus, the beam of EUV radiation emitted from the illumination-optical system 127 is reflected and condensed by the concave mirror 129, directed by the mirror 131, and focused on the reflective surface of the reticle 133.

The reticle 133 includes a multilayer film so as to be highly reflective to incident EUV light. A reticle pattern, corresponding to the pattern to be transferred to a substrate 139, is defined in an EUV-absorbing layer formed on the multilayer film of the reticle 133, as discussed later below. The reticle 133 is mounted via a reticle chuck on a reticle stage 135 that moves the reticle 133 at least in the Y direction. The reticle 133 normally is too large to be illuminated entirely during a single exposure "shot" of the EUV beam. As a result of the mobility of the reticle stage 135, successive regions of the reticle 133 can be irradiated sequentially so as to illuminate the pattern in a progressive manner with EUV light from the mirror 131.

A projection-optical system 137 and substrate (such as a semiconductor wafer) 139 are disposed in that order downstream of the reticle 133. The projection-optical system 137 comprises multiple multilayer-film reflective mirrors that collectively demagnify an aerial image of the illuminated portion of the pattern on the reticle 133. The demagnification normally is according to a predetermined demagnification factor such as ¼. The projection-optical system 137 focuses an aerial image of the illuminated pattern portion onto the surface of the substrate 139. Meanwhile, the substrate 139 is mounted via a wafer (substrate) chuck on a substrate stage 141 that is movable in the X, Y, and Z directions.

Connected to the exposure chamber 143 via a gate valve 145 is a preliminary-evacuation ("load-lock") chamber 147. The load-lock chamber 147 allows exchanges of the reticle 133 and/or substrate 139 as required. The load-lock chamber 147 is connected to a vacuum pump 149 that evacuates the load-lock chamber 147 to a vacuum level substantially equal to the vacuum level inside the exposure chamber 143.

During a microlithographic exposure, EUV light from the illumination-optical system 127 irradiates the reflective surface of the reticle 133. Meanwhile, the reticle 133 and substrate 139 are moved by their respective stages 135 and 141 in a synchronous manner relative to the projection-optical system 137. The stages 135 and 141 move the reticle 133 and the substrate 139, respectively, at a velocity ratio determined by the demagnification factor of the projection-optical system 137. Thus, the entire circuit pattern defined on the reticle 133 is transferred, in a step-and-scan manner, to one or more "die" or "chip" locations on the substrate 139. By way of example, each "die" or "chip" on the substrate 139 is a square having 25-mm sides. The pattern is thus "transferred" from the reticle 133 to the substrate at very high resolution (such as sufficient to resolve a 0.07-i m line-and-space (L/S) pattern). So as to be imprintable with the projected pattern, the upstream-facing surface of the substrate 139 is coated with a suitable "resist."

In the system 110 of FIG. 5 at least one multilayer-film optical element as described above is included in at least one of the illumination-optical system 127, the reticle 133, and the projection-optical system 137.

As described above, a photolithography system according to the above-described embodiments can be built by assembling various subsystems, including each element listed in the appended claims, in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, total adjustment is performed to make sure that every accuracy is maintained in the complete photolithography system. Additionally, it is desirable to manufacture an exposure system in a clean room where the temperature and humidity are controlled.

Figure 6:
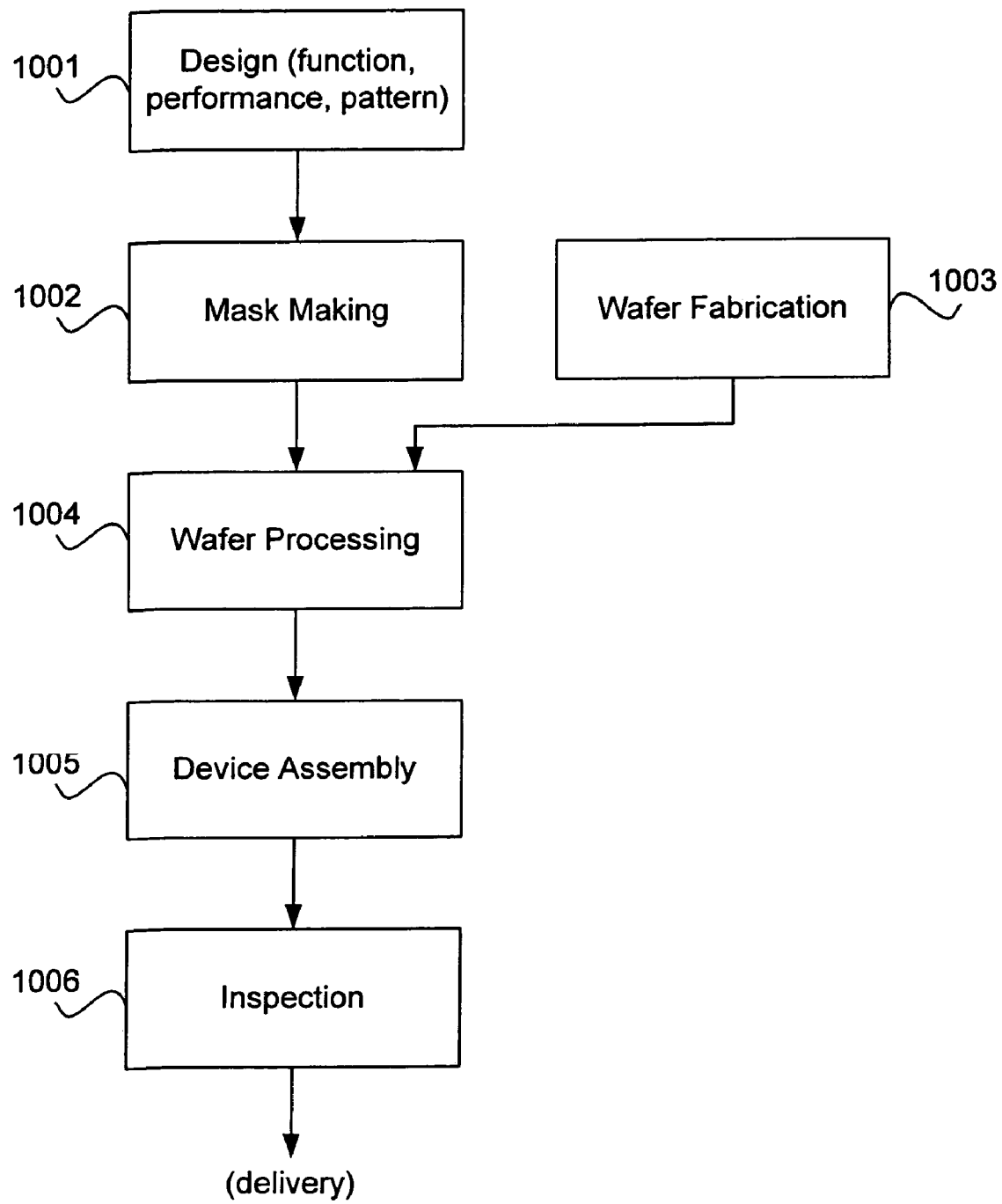
FIG. 6 illustrates an exemplary flow diagram that describes how semiconductor devices are fabricated using the lithographic exposure apparatus as shown in FIG. 5.

Further, semiconductor devices can be fabricated using the above-described systems, by the process shown generally in FIG. 6. In step 1001 the device's function and performance characteristics are designed. Next, in step 1002, a reticle having a pattern it designed according to the previous designing step, and in a parallel step 1003, a wafer is made from a silicon material. The reticle pattern designed in step 1002 is exposed onto the wafer from step 1003 in step 1004 by a photolithography system such as the systems described above. In step 1005 the semiconductor device is assembled (including the dicing process, bonding process and packaging process), then finally the device is inspected in step 1006.

Figure 7:
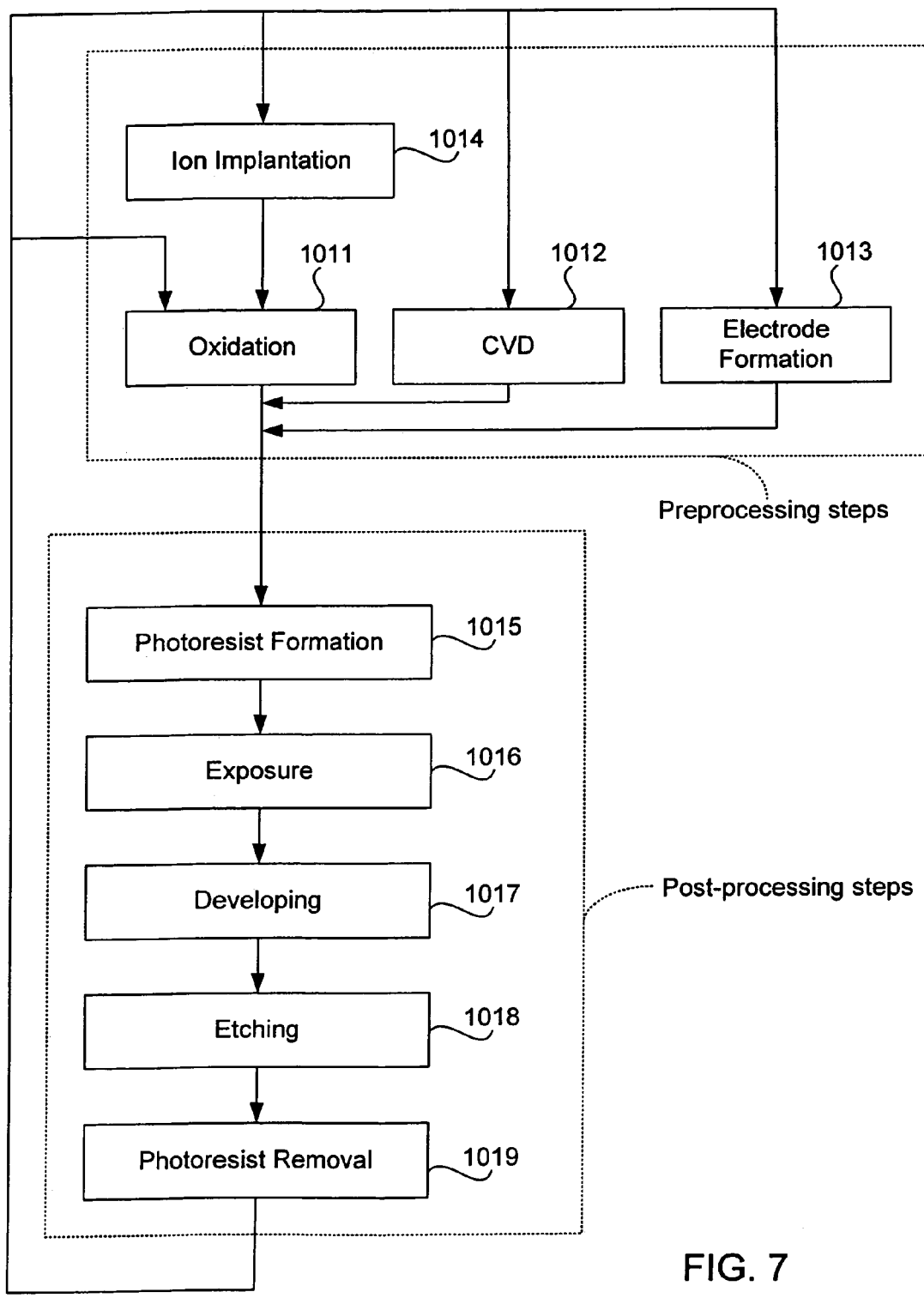
FIG. 7 illustrates a detailed flowchart example of step 1004 of the flow diagram in FIG. 6.

FIG. 7 illustrates a detailed flowchart example of the above-mentioned step 1004 in the case of fabricating semiconductor devices. In step 1011 (oxidation step), the wafer surface is oxidized. In step 1012 (CVD step), an insulation film is formed on the wafer surface. In step 1013 (electrode formation step), electrodes are formed on the wafer by vapor deposition. In step 1014 (ion implantation step), ions are implanted in the wafer. The above-mentioned steps 1011-1014 form the preprocessing steps for wafers during wafer processing, and selection is made at each step according to processing requirements.

At each stage of wafer processing, when the above-mentioned preprocessing steps have been completed, the following post-processing steps are implemented. During post-processing, initially, in step 1015 (photoresist formation step), photoresist is applied to a wafer. Next, in step 1016, (exposure step), the above-mentioned exposure device is used to transfer the circuit pattern of a reticle to a wafer. Then, in step 1017 (developing step), the exposed wafer is developed, and in step 1018 (etching step), parts other than residual photoresist (exposed material surface) are removed by etching. In step 1019 (photoresist removal step), unnecessary photoresist remaining after etching is removed. Multiple circuit patterns are formed by repetition of these preprocessing and post-processing steps.

FIGS. 8-10 will now be described to show exemplary components used in EUV photolithographic techniques for semiconductor manufacturing, which can incorporate the present invention. The particle collection techniques of the present invention are particularly beneficial in EUV systems when used to protect the EUV reticle from contamination from particles. Particles are especially agitated and migrate throughout a system when vacuum pressures are pulled within containment areas.

FIG. 8 illustrates an EUV reticle 800, a clean filter pod 802, and a reticle carrier 804 according to one embodiment. Directional arrows show that reticle 800 can be placed within clean filter pod (CFP) 802, which can in turn be placed within reticle carrier 804. Reticle 800 is a substrate having a patterned region off of which light can be reflected in order to expose a particular pattern of light onto a working layer substrate, such as a layer of photoresist. In some embodiments, the substrate forming reticle 800 is made of quartz and the patterning is formed of chrome. Typically, the patterning is formed on one surface of the reticle substrate. It is particularly important to maintain the patterned region of reticle 800 particle-free.

Clean filter pod (CFP) 802 is formed of a top cover 806 and a bottom cover 808, which can be placed together to seal reticle 800 within. Top cover 806 and bottom cover 808 are used to store, transport, and protect reticle 800 in a particle-free environment until reticle 800 is ready to be used. CFP 802 can be formed of various types of material and in some embodiments can be made of a clear material so that reticle 800 can be visible through CFP 802. A clear CFP 802 is useful for inspection of reticle 800. Mechanical stabilizers 810 are provided in top cover 806 and in bottom cover 808 to make contact with and stabilize reticle 800 within CFP 802. Stabilizers 810 can prevent reticle 800 from moving within CFP 802 during transportation. Stabilizers 810 can be formed of solid structures, bellows, or springs. Particles are potentially generated whenever top cover 806 and bottom cover 808 come into and out of contact with each other, or when a reticle is placed into and out of contact with either of top cover 806 and bottom cover 808.

FIG. 9 illustrates a side plan view of CFP 802 that contains reticle 800. Top cover 806 is placed together with bottom cover 808 to enclose reticle 800 within an interior cavity. Top cover 806 includes a filter port 809 that allows for equalization between the pressure within the interior cavity of CFP 802 and the pressure outside of CFP 802. Filter port 809 allows for such equalization while preventing contaminating particles from entering into the interior cavity of CFP 802.

Referring back to FIG. 8, reticle carrier 804 includes a lid 812 and a base 814, which can be placed together to enclose CFP 802. Reticle carrier 804 is typically used to store, protect, and transport CFP 802 while CFP 802 is outside of a semiconductor manufacturing system.

The present invention can be utilized in each of the regions where two or more components come into contact with each other. Implementing the invention allows for reduction of contamination due to particles generated from the points of contact between any of the components. That is, at least one of the components can be formed of a magnetic material and a magnetic field can then be imposed in the region of contact between the components. Points of contact include reticle 800 coming into contact with either of top cover 806 or bottom cover 808 when reticle is placed into and taken out of CFP 802. Contact between two components also includes contact between reticle 800 and components such as mechanical structures for transporting reticle 800 or a reticle stage used for support during a photolithographic process. Contact between CFP 802 and reticle carrier 804 and between lid 812 and base 814 can also cause particle generation.

To minimize contamination that can occur due to particle generation from any two components that come into contact with each other, at least one of the components will be made out of a magnetic material and a magnet can be placed near the components. As described above, the magnet is then used to attract the particles away from devices that may be contaminated. In some situations, an entire component can be formed of a magnetic material and in other situations, only the portion of a component that comes into contact with another component is formed of a magnetic material.

The magnet can be positioned in various places so long as the magnetic field flows through the region where particles can wear off of contacting components. For instance, pads of a magnetic material can be placed within CFP 802 at an area that makes contact with reticle 800. Then, a magnet can be placed in the region where the reticle and the pad come into contact in order to attract any particles. For example, a magnet can be attached to CFP 802. In an alternative embodiment, both of the contact points can be formed of a magnetic material. In another embodiment, one of the components can be a magnet in itself. And in another embodiment, a magnetic component can be placed in contact with a magnetic component so that it becomes part of the magnetic circuit.

The invention can also be implemented to prevent contamination when top cover 806 and bottom cover 808 of CFP 802 come into and out of contact with each other. FIG. 10 illustrates an enlarged and partial view of reticle 800 that is enclosed within CFP 802, according to one embodiment of the present invention. FIG. 10 illustrates contact points between top cover 806 and bottom cover 808, between stabilizer 810 and reticle 800, and between reticle 800 and a support stem 816. Contact between these components can cause particles to wear off of these components where contamination of critical area 818 on reticle 800 would be detrimental to the operation of a manufacturing system. Critical area 818 of reticle 800 is the patterned region of the reticle. In an alternative embodiment, critical area 818 is only on one surface of reticle 800.

Contact between reticle 800 and stabilizer 810 incorporates the present invention by forming the portion of stabilizer 810 that makes contact with reticle 800 out of a magnetic material. Additionally, the portion of stabilizer 810 that is in contact with reticle 800 is in contact with magnet 821. In an alternative embodiment, the portion of stabilizer 810 that comes into contact with reticle 800 is itself magnetized and magnet 821 is not needed. In either case, magnetic field 820 is created and flows through stabilizer 810 and the region on reticle 800 that is in contact with stabilizer 810. Particles that may wear off of stabilizer 810 are then attracted back to stabilizer 810 so that they do not migrate towards critical area 818 of reticle 800. In some embodiments the tip of stabilizer 810 is formed of nickel.

In some embodiments, the portion of stabilizer 810 that is in contact with reticle 800 is also made of a softer material than that which forms reticle 800. This ensures that particles emanate from stabilizer 810 and are therefore magnetic and can be attracted back towards stabilizer 810.

Contact between reticle 800 and support stem 816 also incorporates the present invention by forming at least support stem 816 or the region of reticle 800 that is in contact with support stem 816 out of a magnetic material. Typically, support stem 816 will be made of a magnetic material such as nickel. Magnet 822 is embedded within bottom cover 808 of CFP 802 in order to attract any particles that wear off of support stem 816. In alternative embodiments, magnet 822 can also be attached to the inside of the outside surface of bottom cover 808, so long as the magnetic field flows through the contact area between support stem 816 and reticle 800. In some embodiments, a magnet can be 0.5 mm square to about 1 mm square in size, however various sizes and shapes of magnets can be used.

In some embodiments, support stem 816 can be formed of a softer material than that of reticle 800. In some embodiments, a pad of magnetic material can be placed on reticle 800 where support stem 816 comes into contact with reticle 800. In these embodiments, particles that wear off of the pad can also be collected by magnet 822.

Contact between top cover 806 and bottom cover 808 of CFP 802 also incorporates the present invention by placing a magnetized piece of material 824 within bottom cover 808. In this way, particles that wear off of magnetized material 824 become attracted to the magnetized material 824. The portion of bottom cover 808 that surrounds magnetized material 824 and which also comes into contact with top cover 806 is formed of a magnetic material. In some embodiments, the material that forms magnetized material 824 and the portion of bottom cover 808 that comes into contact with top cover 806 is formed of a softer material than that which forms top cover 806. In other embodiments, the portion of top cover 806 that comes into contact with bottom cover 808 is also formed of a magnetic material.

In alternative embodiments of the present invention, each of the various embodiments of the invention as described in FIGS. 2-4 can be implemented in each of the contact areas shown in FIG. 10.

In another example, the contact points of an end-effector can be formed of nickel or some other magnetic material. The contact points of an end-effector can come into contact with a reticle surface made of, for example, nickel, quartz, or chrome. Preferably, the reticle contact surface is of a material that is harder than the material forming the end-effector so that particles are more likely to wear off of the contact point of the end-effector, which will then be attracted by a magnet.

Other contact areas that can incorporate the present invention include the contact points between reticle carrier 804 and CFP 802, between lid 812 and base 814, between gate valves used to seal gates, in support structures for supporting a stack of CFP's 802, for example in a library of CFP's, between an alignment device and a reticle 800 where the alignment device aligns reticle 800 for loading onto a reticle chuck, and between a reticle 800 and the reticle chuck itself.

Figure 11:
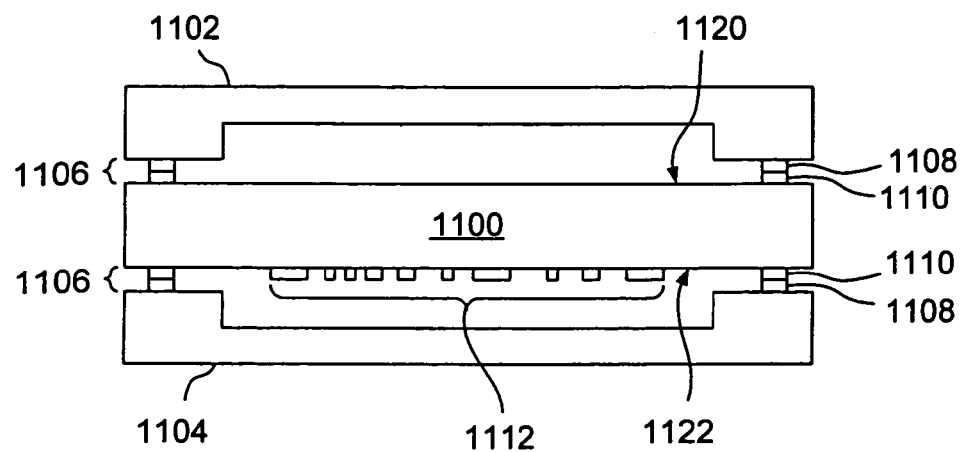
FIG. 11 illustrates a side plan, cross-sectional view of a reticle that is enclosed within an upper cover and a lower cover according to an alternative embodiment of the present invention.

FIG. 11 illustrates a side plan, cross-sectional view of a reticle 1100 that is enclosed within an upper cover 1102 and a lower cover 1104 according to an alternative embodiment of the present invention. A seal 1106 on each of the upper and lower surfaces of reticle 1100 allows an upper surface 1120 and a lower surface 1122 of reticle 1100 to be sealed underneath upper cover 1102 and lower cover 1104, respectively. Each seal 1106 includes a magnetized cover coating 1108, which is attached to upper cover 1102 and to lower cover 1104, and a magnetized reticle coating 1110, which is attached to upper surface 1120 and lower surface 1122 of reticle 1100.

Figure 12:
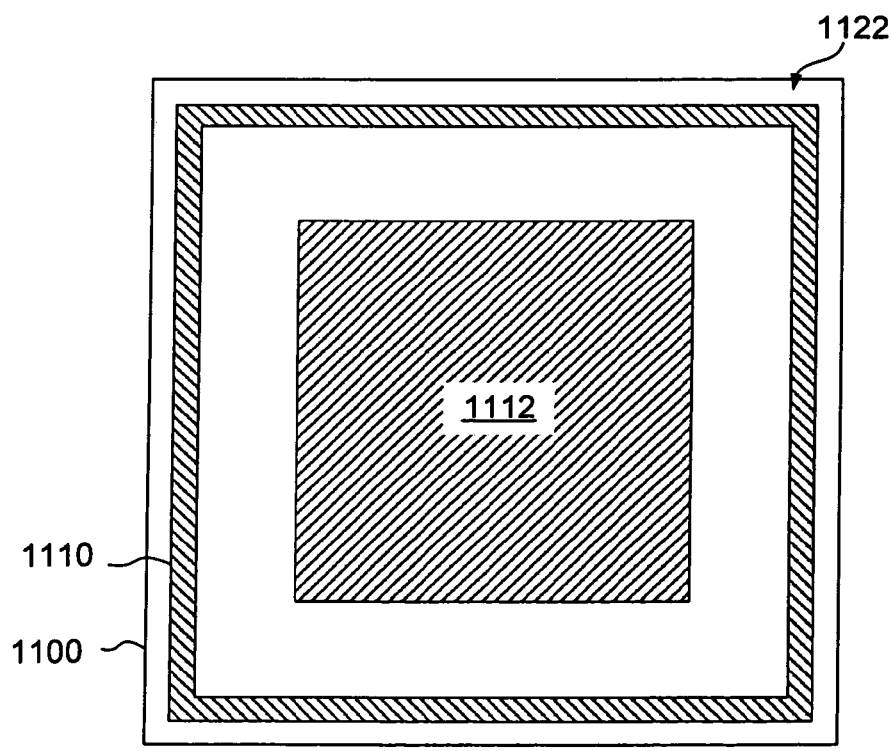
FIG. 12 illustrates a bottom plan view of the reticle of FIG. 11.

FIG. 12 illustrates a bottom plan view of reticle 1100 of FIG. 11. Magnetic reticle coating 1110 forms a thin strip that runs around the perimeter of reticle 1100. Cover coatings 1108 have a shape that corresponds to reticle coating 1110 so that the two coatings can come together to form seal 1106 on each of upper and lower surfaces 1120 and 1122, respectively, or reticle 1100. Reticle 1100 has a patterned area 1112 through which light can be directed in order to shine a pattern of light onto a substrate.

Upper cover 1102 and lower cover 1104 are transparent to infrared radiation for radiative heating of the reticle. Covers 1102 and 1104 are also transparent to visible radiation for purposes such as inspection of the reticle. The transparent characteristic of covers 1102 and 1104 allow for heating and inspection of the reticle without removing any of the covers from reticle 1100. Each of upper and lower covers 1102 and 1104 enclose a substantial portion of upper and lower surfaces 1120 and 1122, respectively, to protect reticle 1100 from contaminating particles and from physical damage. Lower cover 1104 encloses patterned area 1112, which is a very sensitive area with regards to contamination.

Seals 1106 allow for a tight seal between covers 1102 and 1104 and reticle 1100 and ensure that contaminating particles do not reach reticle 1100. Magnetized cover coatings 1108 and magnetized reticle coatings 1110 come together to form seal 1106. The magnetic material of cover coatings 1108 and reticle coatings 1110 ensure that particles that are generated from coatings 1108 and 1110 are magnetic. In this way, the magnetic particles are attracted towards and become attached to either of cover coating 1108 and reticle coating 1110 such that they do not contaminate reticle 1100. Magnetic particles can emanate from cover coatings 1108 and reticle coatings 1110 due to contact between the coatings, for example, when upper cover 1102 and lower cover 1104 are attached and/or removed from reticle 1100.

The magnetic field strength generated between cover coatings 1108 and reticle coatings 1110 should be sufficiently large to attract the particles that come off of the coatings. In some embodiments, the attractive force between cover coating 1108 and reticle coatings 1110 is less than the weight of each of upper cover 1102, bottom cover 1104, and reticle 1100. As is commonly known, the weight of an object is the product of the object's mass and the force of gravity. In these embodiments, the magnetic coatings 1108 and 1110 produce attractive forces that are strong enough to attract magnetic particles yet allow upper cover 1102 and lower cover 1104 to be easily removed from reticle 1100. For instance, upper cover 1102 can be removed from reticle 1100 without holding down reticle 1100. In contrast, if the attractive force between cover coating 1108 and reticle coating 1110 were large, then reticle 1100 would remain attached to upper cover 1102 in an attempt to remove upper cover 1102. Actually, an attempt to remove upper cover 1102 may lift reticle 1100 and lower cover 1104 along with upper cover 1102. Removal of the covers 1102 or 1104 would be more burdensome since a force would be required to restrain one of the covers or reticle 1100.

In alternative embodiments of the present invention, the amount of attractive force between magnetic components that come into contact with each other can likewise be reduced to facilitate the separation of the magnetic components.

As shown in FIG. 11, upper and lower covers 1102 and 1104 leave side surfaces of reticle 1100 exposed. However, in an alternative embodiment, upper and lower covers 1102 and 1104 can come together to completely enclose reticle 1100. In some embodiments, one or both of upper cover 1102 and lower cover 1104 can have a filter to allow gas to flow into and out of the area enclosed by each cover to allow for pressure equalization. Such filters are sized so that contaminating particles of certain sizes cannot enter into the enclosed area.

Note that FIGS. 8-12 only represent a small portion of an entire semiconductor manufacturing system. Therefore, it should be understood that the present invention can be incorporated throughout a semiconductor manufacturing system at points where any two components come together and can potentially create particle contamination. The present invention can also be used in systems other than semiconductor manufacturing systems wherein contamination due to particles generated through is of concern.

Additionally, the present invention can be used within machinery that having moving parts such as belts and pulleys. For example, the belt or a pulley can be made out of a magnetic material so that any particles that wear off can be attracted by a magnet.

While this invention has been described in terms of several preferred embodiments, there are alteration, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

I claim:

1. An apparatus comprising:
an enclosure configured to enclose a reticle, the enclosure including a seal, the seal comprising:
a first component;
a second component made of a magnetic material, the first component and the second component configured to be placed into contact with one another; and
a magnetic element positioned adjacent to the first component and the second component, the magnetic element configured to generate a magnetic field in the vicinity of the first and the second components so that magnetic particles generated when the first component and the second component are in contact are moved in a direction of high flux density created by the magnetic element.

2. An apparatus as recited in claim 1 wherein the first component is made of a magnetic material.

3. An apparatus as recited in claim 1 wherein the first component is made of a non-magnetic material.

4. An apparatus as recited in claim 3 wherein the nonmagnetic material of the fist component is softer than the magnetic material of the second component.

5. An apparatus as recited in claim 1 wherein the second component is formed of a softer material than the material that forms the first component.

6. An apparatus as recited in claim 1 wherein the second component and the magnetic element are configured as a single magnetic structure.

7. An apparatus as recited in claim 1 wherein the second component and the magnetic element are separate magnetic structures separated by a gap.

8. An apparatus as recited in claim 1 wherein the second component is formed of a ferromagnetic or a ferrimagnetic material.

9. An apparatus as recited in claim 8 wherein the second component is formed of nickel.

10. An apparatus as recited in claim 1 wherein the second component is magnetized such that the second component generates a magnetic field and the magnetic particles are attracted towards the second component.

11. An apparatus as recited in claim 1 further comprising:
a semiconductor manufacturing device that is positioned proximate to the first and second components, wherein magnetic element prevents the magnetic particles from contaminating the semiconductor manufacturing device.

12. An apparatus as recited in claim 11 wherein the semiconductor manufacturing device is a reticle.

13. An apparatus as recited in claim 11 wherein the semiconductor manufacturing device is positioned on a side of the first and second components that is opposite from the magnetic element, whereby the magnetic particles are attracted away from the semiconductor manufacturing device.

14. An apparatus as recited in claim 11 wherein the semiconductor manufacturing device is used within a semiconductor manufacturing system that uses light in the extreme ultra-violet wavelength range.

15. An apparatus as recited in claim 1 wherein the first component forms at least a portion of a top cover and the second component forms at least a portion of a bottom cover, the apparatus further comprising:
a reticle used for semiconductor manufacturing, wherein the top and bottom covers are suitable for enclosing the reticle.

16. An apparatus as recited in claim 15 wherein an attractive force between the first component and the second component is less than the weight of each of the reticle, top cover, and the bottom cover such that the top cover can be removed from the bottom cover without restraining the bottom cover, or vice-versa, wherein weight is the product of mass and a gravitational force.

17. An apparatus as recited in claim 1 wherein the first component forms a portion of a reticle and the second component forms a portion of a container for containing the reticle.

18. An apparatus as recited in claim 1 wherein the first component forms a portion of a reticle and the second component forms a portion of a mechanical arm for supporting and transporting the reticle.

19. An apparatus as recited in claim 1 wherein the first component forms a portion of a reticle and the second component forms a portion of an electrostatic chuck.

20. An apparatus as recited in claim 1 wherein the first component forms a portion of a reticle and the second component forms a portion of a vacuum chuck.

21. An apparatus as recited in claim 1 wherein the first component is a contact area of an extreme ultraviolet reticle.

22. An apparatus as recited in claim 21 wherein the contact area of the extreme ultraviolet reticle is formed of nickel.

23. An apparatus as recited in claim 11 wherein the first component forms a portion of a gate and the second component forms a portion of a frame, wherein the gate and the frame come into and out of contact with each other upon opening and closing of the gate.

24. A method for minimizing contamination comprising:
enclosing a reticle within an enclosure, the enclosure including a seal that is comprised of a first and a second component wherein the second component is magnetic;
placing the first component into contact with the second component wherein magnetic particles are generated;
positioning a magnetic element adjacent to the first component and the second component, the magnetic element configured to generate a magnetic field in the vicinity of the first and second components so that the magnetic particles are moved in a direction of high flux density created by the magnetic element.

25. A method as recited in claim 24 further comprising:
separating the first component and the second component from each other.

26. A method as recited in claim 24 further comprising:
positioning the magnetic element in contact with the second component such that the second component becomes part of a magnetic circuit, whereby the magnetic particles from the second component are attracted to the second component.

27. A method as recited in claim 24 wherein the first component is made of a magnetic material.

28. A method as recited in claim 24 wherein the second component is formed of a softer material than the material that forms the first component.

29. A method as recited in claim 24 wherein the second component is formed of a ferromagnetic or a ferrimagnetic material.

30. A method as recited in claim 29 wherein the second component is formed of nickel.

31. A method as recited in claim 24 further comprising:
providing a semiconductor manufacturing device that is positioned proximate to the first and second components, wherein the magnetic particles can contaminate the semiconductor manufacturing device.

32. A method as recited in claim 31 further comprising:
positioning the semiconductor manufacturing device on a side of the first and second components that is opposite from the magnetic element, whereby the magnetic particles are attracted away from the semiconductor manufacturing device.

33. A method as recited in claim 24 wherein the first component forms a portion of a reticle and the second component forms a portion of a mechanical arm for supporting and transporting the reticle.

34. A method as recited in claim 24 wherein at least one of the first component or the second component is a semiconductor manufacturing device.

35. A lithography system comprising:
an illumination source;
an optical system;
a reticle;
an enclosure that encloses the reticle, the enclosure having a seal, the seal comprising:
a first component;

a second component made of magnetic material, the first and the second components configured to be placed into contact with one another; and a magnetic element positioned adjacent to the first and second components, the magnetic element configured to generate a magnetic field in the vicinity of the first and the second components so that magnetic particles generated when the first component and the second component are in contact are moved in a direction of high flux density created by the magnetic element.

36. A system as recited in claim 35 wherein the magnetic element is placed in contact with the second component such that the second component becomes part of a magnetic circuit, whereby the magnetic particles are attracted to the second component.

37. A system as recited in claim 35 wherein the second component is formed of a softer material than the material that forms the first component.

38. A system as recited in claim 35 wherein the reticle is positioned on a side of the first and second components that is opposite from the magnetic element, whereby the magnetic particles are attracted away from the reticle.

* * * * *

UNITED STATES PATENT AND TRADEMARK OFFICE
CERTIFICATE OF CORRECTION

| | | |
|---|---|---|
| PATENT NO. | : 7,551,265 B2 | Page 1 of 1 |
| APPLICATION NO. | : 10/956606 | |
| DATED | : June 23, 2009 | |
| INVENTOR(S) | : Alton H. Phillips | |

It is certified that error appears in the above-identified patent and that said Letters Patent is hereby corrected as shown below:

CLAIMS:

1. In line 2 of claim 4 (column 17, line 2) change "fist" to --first--.

2. In line 3 of claim 11 (column 17, line 24) change "the first and second" to --the first and the second--.

3. In line 3 of claim 13 (column 17, line 32) change "first and second" to --first and the second--.

4. In line 6 of claim 15 (column 17, line 44) change "the top and bottom" to --the top and the bottom--.

5. In line 3 of claim 16 (column 17, line 48) change "reticle, top cover" to --reticle, the top cover--.

6. In line 10 of claim 24 (column 18, line 19) change "the first and second" to --the first and the second--.

7. In line 3 of claim 31 (column 18, line 43) change "the first and second" to --the first and the second--.

8. In line 3 of claim 32 (column 18, line 48) change "the first and second" to --the first and the second--.

9. In lines 12 of claim 35 (column 19, lines 5) change "second components," to --the second components,--.

10. In line 2 of claim 38 (column 20, line 8) change "the first and second" to --the first and the second--.

Signed and Sealed this
Twentieth Day of December, 2011

David J. Kappos
*Director of the United States Patent and Trademark Office*